United States Patent
Xu et al.

(10) Patent No.: US 12,284,875 B2
(45) Date of Patent: Apr. 22, 2025

(54) DISPLAY PANEL AND DISPLAY APPARATUS FOR UNIFORM DISPLAY OF A FIRST DISPLAY AREA AND A SECOND DISPLAY AREA

(71) Applicant: KunShan Go-Visionox Opto-Electronics Co., Ltd, Jiangsu (CN)

(72) Inventors: Chuanzhi Xu, Kunshan (CN); Lu Zhang, Kunshan (CN); Zhengfang Xie, Kunshan (CN); Zhenzhen Han, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 466 days.

(21) Appl. No.: 17/711,381

(22) Filed: Apr. 1, 2022

(65) Prior Publication Data

US 2022/0223673 A1 Jul. 14, 2022

Related U.S. Application Data

(63) Continuation of application No. PCT/CN2020/124490, filed on Oct. 28, 2020.

(30) Foreign Application Priority Data

Apr. 27, 2020 (CN) .......................... 202010346189.5

(51) Int. Cl.
*H10K 59/121* (2023.01)
*H10K 59/131* (2023.01)
(Continued)

(52) U.S. Cl.
CPC ....... *H10K 59/1213* (2023.02); *H10K 59/131* (2023.02); *H10D 86/441* (2025.01); *H10D 86/60* (2025.01); *H10K 59/351* (2023.02)

(58) Field of Classification Search
CPC ............. H10K 59/1213; H10K 59/131; H10K 59/351; H10K 59/353; H10K 59/352;
(Continued)

(56) References Cited

U.S. PATENT DOCUMENTS

| 9,455,310 B2 | 9/2016 | Lee |
| 2009/0072229 A1* | 3/2009 | Suh ...................... H10K 59/131 257/66 |

(Continued)

FOREIGN PATENT DOCUMENTS

| CN | 104885251 A | 9/2015 |
| CN | 105633297 A | 6/2016 |

(Continued)

OTHER PUBLICATIONS

International Search Report issued on Jan. 29, 2021 in corresponding for International Application No. PCT/CN2020/124490; 15 pages.

(Continued)

*Primary Examiner* — Duy T Nguyen
(74) *Attorney, Agent, or Firm* — Maier & Maier, PLLC

(57) ABSTRACT

A display panel and a display apparatus. The display panel includes first and second display areas. The first display area includes a transparent display area and a transition display area. The display panel includes a device layer and a light-emitting element layer. The light-emitting element layer includes a first pixel structure arranged in the first display area. The first pixel structure includes a plurality of first sub-pixels, and the first sub-pixels include first electrodes. The device layer includes first driving transistors, and the first driving transistors include first gate electrodes. In a stacking direction the light-emitting element layer stacked with the device layer, an orthographic projection of a first gate electrode of one first driving transistor does not (Continued)

overlap with an orthographic projection of a first electrode of a first sub-pixel emitting a color different from another first sub-pixel driven by that first driving transistor.

20 Claims, 6 Drawing Sheets

(51) Int. Cl.
*H10K 59/35* (2023.01)
*H10D 86/40* (2025.01)
*H10D 86/60* (2025.01)

(58) Field of Classification Search
CPC ....... H10K 59/65; H01L 27/124; G09F 9/302; H04M 1/0264; H04M 1/0266; H10D 86/441; H10D 86/60
USPC .......................................................... 257/72
See application file for complete search history.

(56) References Cited

U.S. PATENT DOCUMENTS

| | | | | |
|---|---|---|---|---|
| 2012/0127064 | A1* | 5/2012 | Kawano | G09G 3/3225 345/76 |
| 2012/0133683 | A1* | 5/2012 | Goden | G09G 3/3233 345/77 |
| 2016/0079332 | A1* | 3/2016 | Lee | H10K 50/858 257/40 |
| 2019/0237520 | A1* | 8/2019 | Tian | H10K 59/353 |
| 2019/0305051 | A1 | 10/2019 | Takahashi et al. | |
| 2019/0392748 | A1* | 12/2019 | Ahn | G09G 3/3233 |
| 2020/0013327 | A1* | 1/2020 | Thirumalai | G09G 3/364 |

FOREIGN PATENT DOCUMENTS

| | | | |
|---|---|---|---|
| CN | 109698224 A | 4/2019 | |
| CN | 109901327 A | 6/2019 | |
| CN | 109905502 A | 6/2019 | |
| CN | 109962092 A | 7/2019 | |
| CN | 110047386 A | 7/2019 | |
| CN | 209070895 U | 7/2019 | |
| CN | 110265458 A | 9/2019 | |
| CN | 110491917 A * | 11/2019 | ........... H10K 59/131 |
| CN | 104766875 B | 12/2019 | |
| CN | 110650232 A | 1/2020 | |
| CN | 110728921 A | 1/2020 | |
| CN | 110752239 A | 2/2020 | |
| CN | 110764362 A | 2/2020 | |
| CN | 110767678 A | 2/2020 | |
| CN | 110767694 A | 2/2020 | |
| CN | 110767710 A | 2/2020 | |
| CN | 110767835 A | 2/2020 | |
| CN | 110783384 A | 2/2020 | |
| CN | 110783385 A | 2/2020 | |
| CN | 110783487 A | 2/2020 | |
| CN | 110827744 A | 2/2020 | |
| CN | 110838507 A | 2/2020 | |
| CN | 110854205 A | 2/2020 | |
| CN | 210182387 U | 3/2020 | |
| CN | 111028687 A | 4/2020 | |
| CN | 111833754 A | 10/2020 | |
| EP | 3525064 A1 | 8/2019 | |
| WO | 2020031005 A | 2/2020 | |

OTHER PUBLICATIONS

Office Action issued on Mar. 12, 2021, in connection with corresponding Chinese Application No. 202010346189.5 (22 pp., including machine-generated English translation).

Office Action issued on Jul. 29, 2021, in connection with corresponding Chinese Application No. 202010346189.5 (8 pp., including machine-generated English translation).

Notification to Grant Patent Right for Invention issued on Sep. 27, 2021, in connection with corresponding Chinese Application No. 202010346189.5 (7 pp., including machine-generated English translation).

* cited by examiner

DISPLAY PANEL AND DISPLAY APPARATUS FOR UNIFORM DISPLAY OF A FIRST DISPLAY AREA AND A SECOND DISPLAY AREA

CROSS-REFERENCE TO RELATED APPLICATIONS

This application is a continuation of International Application No. PCT/CN2020/124490, filed on Oct. 28, 2020, which claims priority to Chinese Patent Application No. 202010346189.5, filed on Apr. 27, 2020, both of which are hereby incorporated by reference in their entireties.

TECHNICAL FIELD

The present application relates to the field of display technologies, and in particular to a display panel and a display apparatus.

BACKGROUND

With the rapid development of electronic devices, the requirements of users on screen-to-body proportions become higher and higher. Thus, full-screen displays for electronic devices are interested more and more by the industry.

Conventional electronic devices such as cell phones and tablets need integrated photosensitive components such as cameras and infrared sensing elements. Therefore, in order to increase the light transmittance of areas corresponding to the photosensitive components of the electronic devices, it is necessary to improve the structures of the areas corresponding to the photosensitive devices. Although light sensitivity requirements are met though the modification of the structures, the modification makes the display brightness of the areas different from other areas, which is not bad for the display by the display panel.

Therefore, there is a need for a new type of display panel and display apparatus.

SUMMARY

The present application provides a display panel and a display apparatus. The display panel facilitates the under-screen integration of a photosensitive component, and the display panel makes the display brightness of a first display area and a second display area uniform, which improves the display effect of the display panel.

In an aspect, the embodiments of the present application provide a display panel including: a second display area; a first display area including a transparent display area and a transition display area located between the transparent display area and the second display area, light transmittance of the transparent display area being greater than light transmittance of the second display area; a light-emitting element layer including a first pixel structure arranged in the first display area, the first pixel structure including a plurality of first sub-pixels, and each of first sub-pixels including a first electrode; a device layer stacked with the light-emitting element layer and including a plurality of first driving transistors located in the transition display area, each of the first driving transistors configured to drive one or more first sub-pixels emitting a same color in the transition display area and the transparent display area, and each of the first driving transistors including a first gate electrode; where, in a stacking direction the light-emitting element layer stacked with the device layer, an orthographic projection of a first gate electrode of one of the first driving transistors does not overlap an orthographic projection of a first electrode of a first sub-pixel emitting a color different from another first sub-pixel driven by the first driving transistor.

In another aspect, the embodiments of the present application provide a display apparatus including the above display panel.

According to the display panel and the display apparatus provided by the embodiments of the present application, the light transmittance of the light-transmitting display area of the display panel is greater than the light transmittance of the second display area, and therefore the requirements for under-screen integration of the photosensitive component such as a camera can be met. Since the display panel includes the device layer and the light-emitting element layer, the device layer includes the first driving transistors located in the transition display area, and one or more first sub-pixels emitting the same color in the transition display area and the transparent display area can be driven by each of the first driving transistors, so that the transition display area and the transparent display area can display images, thereby improving the screen-to-body ratio of the display panel. Furthermore, in the stacking direction the light-emitting element layer stacked with the device layer, the orthographic projection of the first gate electrode of one of the first driving transistors does not overlap the orthographic projection of the first electrode of the first sub-pixel emitting the color different from another first sub-pixel driven by the first driving transistor, so that in the first display area, the first gate electrode of the first driving transistor configured to drive the first sub-pixels emitting the same color is not affected by the first electrodes of the first sub-pixels emitting other colors, which reduces or avoids the display brightness difference between the first display area and the second display area, ensuring good display effect.

DETAILED DESCRIPTION

Figure 1:
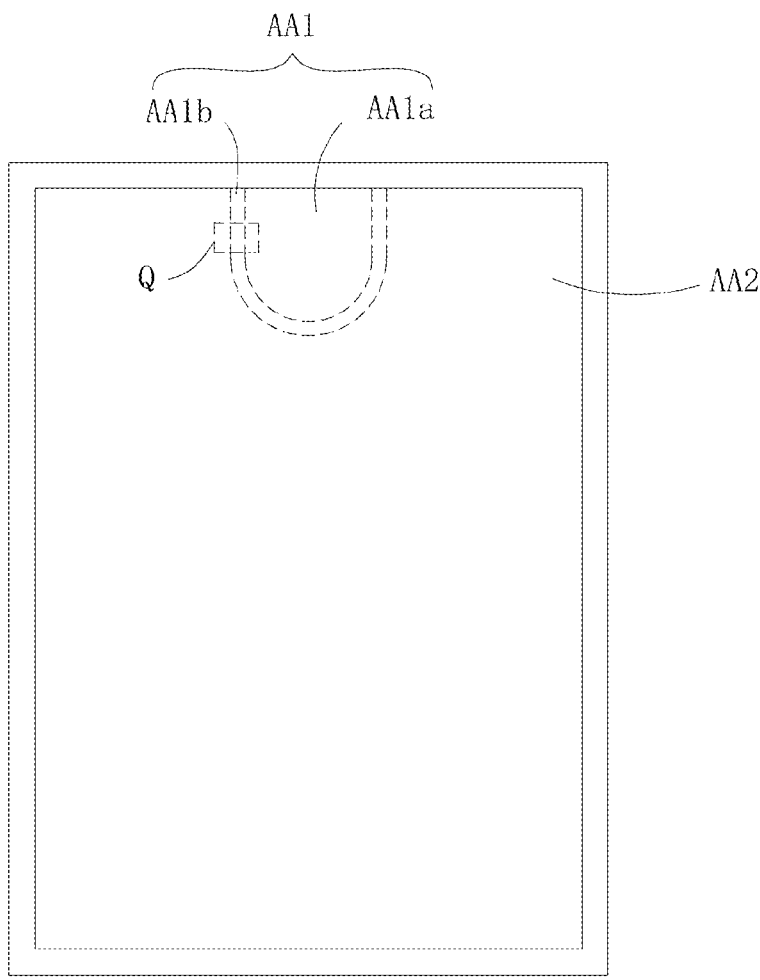
FIG. 1 is a schematic structural diagram of a top view of a display panel according to an embodiment of the present application.

Features of various aspects and exemplary embodiments of the present application will be described in detail below. In order to make the objectives, technical solutions, and advantages of the present application clearer, the present application will be further described in detail below with reference to the drawings and specific embodiments. It should be understood that, the specific embodiments described herein are only configured for explaining the present application, and not configured for limiting the present application. For those skilled in the art, the present application can be implemented without some of those specific details. The following description of the embodiment is only for providing a better understanding of the present application by showing examples of the present application.

It will be understood that, in describing the structure of a component, when one layer or one region is referred to as being "on" or "above" another layer or another region, it means that the one layer or the one region is directly on the another layer or another region, or there are other layers or regions between the one layer or the one region and the another layer or the another region. In addition, if the component is turned upside-down, the one layer or the one region will be "under" or "below" the another layer or the another region.

Features and exemplary embodiments of various aspects of the present application are described in detail below. Furthermore, the features, structures, or characteristics described below may be combined in any suitable manner in one or more embodiments.

In electronic devices such as mobile phones and tablets, photosensitive components (e.g., front cameras, infrared light sensors, and proximity light sensors) are required to be integrated on the side where display panels are provided. In some embodiments, light-transmitting display areas may be provided on the above-mentioned electronic devices, and the photosensitive components may be arranged on the back of the light-transmitting display areas, so that full-screen display by the electronic devices can be realized with the normal operation of the photosensitive components being ensured.

In order to increase the light transmittance of the transparent display area, the pixel density of the transparent display area is generally set to be small. In order to reduce the wiring in the transparent display area, the pixel driving circuits of the transparent display area are usually arranged in the transition display area at the periphery of the transparent display area. However, as the pixel structure or the wiring position of the transparent display area changes, an anode of a sub-pixel emitting one color may be coupled with a pixel driving circuit of a sub-pixel emitting another color (for example, a gate electrode of a driving transistor), which results in parasitic capacitance, and thus crosstalk occurs in the light emission brightness between the sub-pixels emitting different colors, resulting in a difference in the display brightness between the transparent display area corresponding to the photosensitive component and other areas.

Therefore, in order to solve the above-mentioned technical problems, the embodiments of the present application provide a display panel and a display apparatus. The display panel and the display apparatus in the embodiments of the present application are described in detail below with reference to FIG. 1 to FIG. 11.

Figure 2:
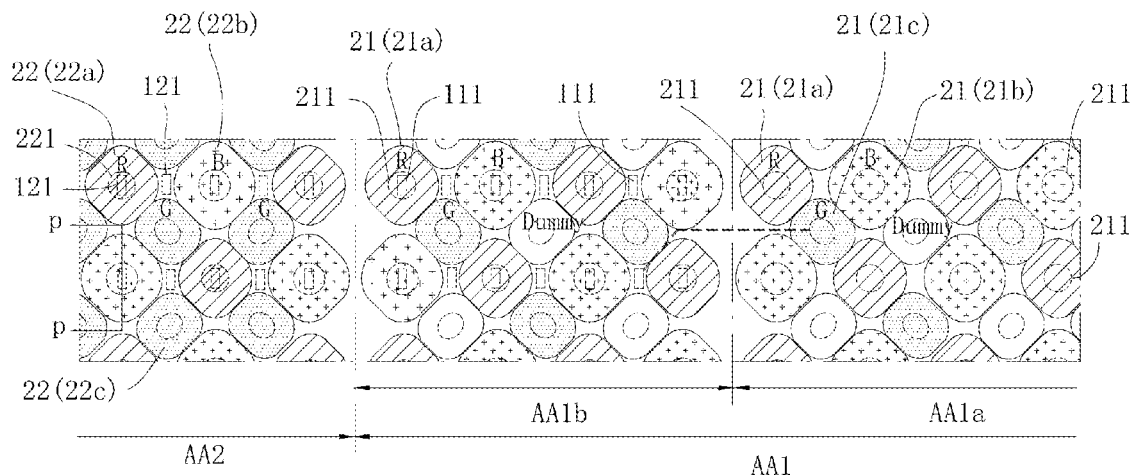
FIG. 2 is a schematic partial enlarged view of the region Q in FIG. 1.

With reference to FIG. 1 and FIG. 2, the embodiments of the present application provide a display panel 100 including a first display area AA1 and a second display area AA2. The first display area AA1 includes a transparent display area AA1a and a transition display area AA1b between the transparent display area AA1a and the second display area AA2. Light transmittance of the transparent display area AA1a is greater than light transmittance of the second display area AA2.

Optionally, the transparent display area AA1a has a light transmittance of 15% or more, or even 40% or even higher. In order to ensure that the transparent display area AA1a has the light transmittance mentioned above, the light transmittance of each functional film layer of the display panel 100 in the embodiments is greater than 80%, and the light transmittance of a part of the functional film layers is even greater than 90%.

In the display panel 100 provided by the embodiments of the present application, the light transmittance of the transparent display area AA1a of the first display area AA1 is greater than the light transmittance of the second display area AA2, so that in the display panel 100, an image acquiring component can be integrated on the back side of the transparent display area AA1a, so as to realize the under-screen integration of components such as a camera. At the same time, the first display area AA1 can display images, so that the display area of the display panel 100 is improved, and the full-screen display by the display apparatus is realized.

With reference to FIG. 1 to FIG. 6, the display panel 100 includes a device layer 10 and a light-emitting element layer 20 that are stacked. The light-emitting element layer 20 includes a first pixel structure arranged in the first display area AA1 and a second pixel structure arranged in the second display area AA2. The first pixel structure includes a plurality of first sub-pixels 21 arranged in a predetermined manner. The second pixel structure includes a plurality of second sub-pixels arranged in a predetermined manner. The first sub-pixel 21 includes a first electrode 211.

Optionally, the device layer 10 includes first driving transistors 11 located in the transition display area AA1b. The device layer 10 further includes second driving transistors 12 located in the second display area AA2. Each first driving transistor 11 is configured to drive one or more first sub-pixels 21 emitting a same color in the transition display area AA1b and the transparent display area AA1a. Each second driving transistor 12 is configured to drive one of the second sub-pixels 22. The first driving transistor 11 includes a first gate electrode 111. In a stacking direction X the light-emitting element layer 20 stacked with the device layer 10, an orthographic projection of a first gate electrode 111 of one of the first driving transistors 11 does not overlap an orthographic projection of a first electrode 211 of a first sub-pixel 21 emitting a color different from another first sub-pixel 21 driven by the first driving transistor 11. That is, the orthographic projection of the first gate electrode 111 of each of the first driving transistors 11 does not overlap (or to say, is offset to) the orthographic projection of the first electrode 211 of a first sub-pixel 21 emitting a color other than the color emitted by the first sub-pixel 21 driven by the first driving transistor 11.

In the display panel 100 provided in the embodiments of the present application, in the stacking direction X the light-emitting element layer 20 stacked with the device layer 10, the orthographic projection of the first gate electrode 111 of one of the first driving transistors 11 does not overlap the orthographic projection of the first electrode 211 of the first sub-pixel 21 emitting a color different from another first sub-pixel 21 driven by the first driving transistor 11, so that in the first display area AA1, the first gate electrode 111 of the first driving transistor 11 configured to drive the first sub-pixels 21 emitting a same color is not affected by the first electrodes 211 of the first sub-pixels 21 emitting different colors. Thus, cross-talk of light brightness does not occur between the first sub-pixels 21 emitting different colors, so that the difference in display brightness between the first display area AA1 and the second display area AA2 is reduced or avoided, ensuring good display effect.

Figure 3:
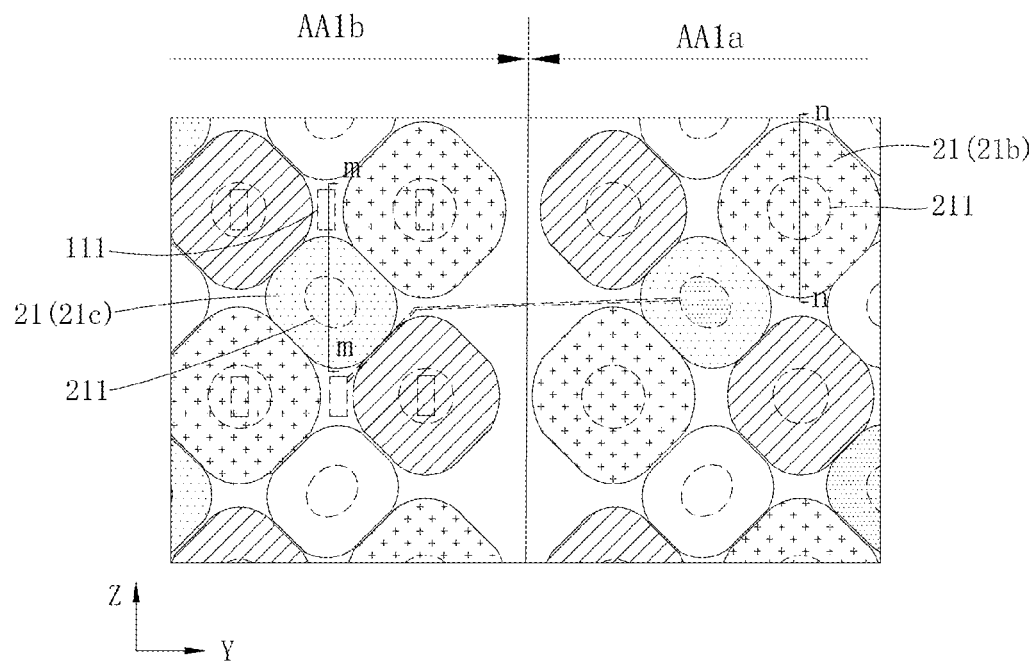
FIG. 3 is a schematic structural diagram of a partial view including a transparent display area and a transition display area in FIG. 2.
Figure 4:
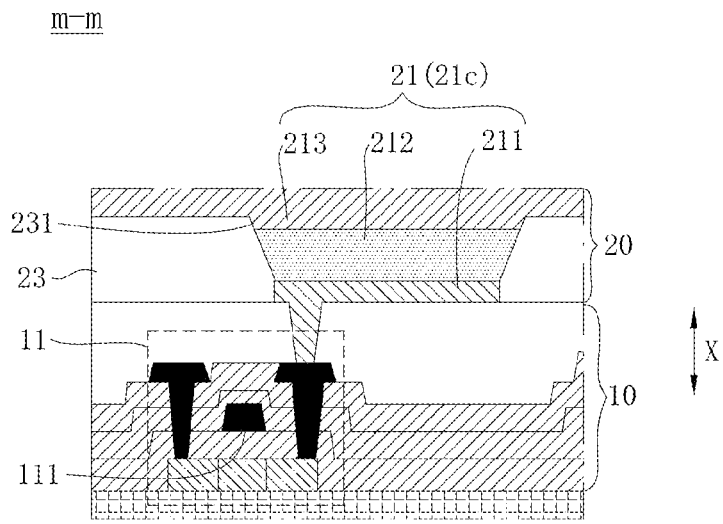
FIG. 4 is a schematic structural diagram of a partial cross-sectional view taken along the direction m-m in FIG. 3.
Figure 5:
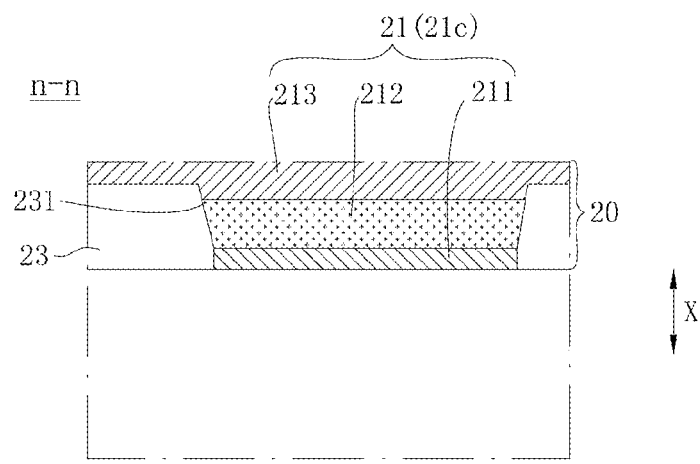
FIG. 5 is a schematic structural diagram of a partial cross-sectional view taken along the direction n-n in FIG. 3.
Figure 6:
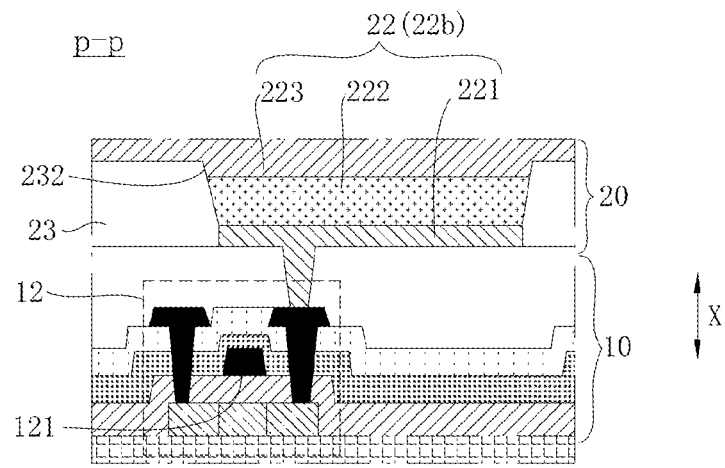
FIG. 6 is a schematic structural diagram of a partial cross-sectional view taken along the direction p-p in FIG. 2.

Optionally, the first sub-pixels 21 in the transparent display area AA1*a* may be driven by the first driving transistors 11 located in the transition display area AA1*b*. For the sake of clarity, it is shown in FIG. 2 and FIG. 3 that the first electrode 211 of only one of the first sub-pixels 21 is connected to the first driving transistor 11 in the transition display area AA1*b* via a connection structure for illustration. In a specific implementation, a corresponding driving transistor may not be provided under each first sub-pixel 21 in the transparent display area AA1*a*, so as to better ensure good light transmittance.

In an optional implementation, in the display panel 100 provided by the above embodiments, an orthographic projection of at least one of the first gate electrodes 111 does not overlap orthographic projections of the first electrodes 211 of the first sub-pixels 21 in the stacking direction X. With the above arrangement, the driving requirements of the first driving transistors 11 located in the transition display area AA1*b* for the first sub-pixels 21 in the transparent display area AA1*a* and the transition display area AA1*b* can be satisfied, and at the same time, the influence on the first gate electrodes 111 of the first driving transistors 11 located in the transition display area AA1*b* configured to drive the first sub-pixels 21 emitting a same color by the first electrodes 211 of the first sub-pixels 21 emitting different colors can be better avoided, so as to reduce the crosstalk of light emission brightness and optimize the display effect.

In some optional embodiments, in the display panel 100 provided by the above embodiments. Each second driving transistor 12 includes a second gate electrode 121. Each second sub-pixel 22 includes a second electrode 221. In the stacking direction X, an orthographic projection of a second gate electrode 121 of one of the second driving transistors 12 does not overlap an orthographic projection of a second electrode 221 of a second sub-pixel 22 emitting a color different from another second sub-pixel 22 driven by the second driving transistor 12. That is, the orthographic projection of the second gate electrode 121 of each of the second driving transistors 12 does not overlap (or to say, is offset to) the orthographic projection of the second electrode 221 of a second sub-pixel 22 emitting a color other than the color emitted by the second sub-pixel 22 driven by the first driving transistor 11.

With the above arrangement, it is ensured that the second gate electrode 121 of the second driving transistor 12 configured to drive the second sub-pixels 22 emitting a same color in the second display area AA2 is not affected by the second electrodes 221 of the second sub-pixels 22 emitting different colors. Thus, crosstalk of light emission brightness does not occur between the second sub-pixels 22 emitting different colors, which further reduces or avoids the difference in display brightness between the first display area AA1 and the second display area AA2, so that the display apparatus 100 has a better display effect.

In addition, with the above arrangement, when the optimal gamma parameter is lowered in a white image of the display panel to make the brightness of the first display area AA1 and the second display area AA2 consistent, it can also be ensured that there is no difference in the brightness between the first display area AA1 and the second display area AA2 when the display panel 100 switches from a white image to a monochrome image.

In an optional implementation, an orthographic projection of at least one of the second gate electrodes 121 does not overlap orthographic projections of the second electrodes 221. The above arrangement can better satisfy the driving requirements of the second sub-pixels 22.

In some optional embodiments, in the display panel 100 provided by the above embodiments, the first pixel structure and the second pixel structure have a same arrangement structure.

Optionally, an arrangement manner of the second sub-pixels 22 of the second pixel structure includes RGBG, where R represents a red sub-pixel, G represents a green sub-pixel, and B represents a blue sub-pixel. In the second pixel structure, at least a part of the second sub-pixels 22 may be repeatedly arranged in a combination order of RGBG. In some optional embodiments, all of the second sub-pixels 22 of the second pixel structure may be repeatedly arranged in the combination order of RGBG. That is, the second sub-pixels 22 of the second pixel structure may be arranged in a Bayer array.

Optionally, the arrangement manner of the first sub-pixels 21 of the first pixel structure includes RGBD, where R represents a red sub-pixel, G represents a green sub-pixel, B represents a blue sub-pixel, and D may refer to an abbreviation of "Dummy". "Dummy" may refer to that the region is provided with a first sub-pixel 21 which makes the arrangement structure in the first pixel structure consistent with the arrangement structure in the second pixel structure. The first sub-pixel 21 may not be provided with a corresponding first driving transistor 11 and is a non-light-emitting first sub-pixel, as long as the light transmittance requirement can be satisfied and/or the periodicity of the pixel arrangement can be ensured. For example, as shown in FIG. 2, D may correspond to the G (i.e., the second green sub-pixel 22*c*) in the second pixel arrangement of the second display area AA2, in order to ensure the periodicity of the pixel arrangement.

At least part of the first sub-pixels 21 in the first pixel structure may be arranged repetitively in a combination order of RGBD, and in some alternative embodiments all first sub-pixels in the first pixel structure may be arranged repetitively in a combination order of RGBD.

With the above arrangement, the periodicity of the plurality of first sub-pixels 21 in the first display area AA1 and the periodicity of the plurality of second sub-pixels 22 in the second display area AA2 in the display panel 100 are ensured. At the same time, the coupling condition of the first gate electrode 111 of the first driving transistor 11 to the corresponding first electrodes 211 in the transitional display area AA1*b* can be better made consistent with or tend to be consistent with the coupling condition of the second gate electrode 121 of the second driving transistor 12 to the corresponding second electrodes 221 in the second display area AA2, so as to better ensure that there is no difference in brightness between the first display area AA1 and the second display area AA2 when the display panel 100 switches from a white image to a monochrome image.

In an optional implementation, in the display panel 100 provided by the above embodiments, the first driving transistors 11 are arranged in rows and columns. Optionally, the second driving transistors 12 are arranged in rows and columns. The above arrangement facilitates connection with corresponding lines such as a data line and a signal line.

In some optional embodiments, in the display panel provided by the above embodiments, the plurality of first sub-pixels 21 in the first pixel structure include first green sub-pixels 21c, first red sub-pixels 21a and first blue sub-pixels 21b. In the stacking direction X, an orthographic projection of a first gate electrode 111 of a first driving transistor 11 configured to drive the first green sub-pixels 21c does not overlap orthographic projections of the first electrodes 211. With the above arrangement, the arrangement of RGBG of the second pixel structure of the display panel 100 and the arrangement of RGBD of the first pixel structure can be facilitated, and at the same time, the row and column arrangement of the first driving transistors 11 and the second driving transistors 12 can be further facilitated.

Optionally, in the first pixel structure, in the stacking direction X, an orthographic projection of a first gate electrode 111 of a first driving transistor 11 configured to drive the first blue sub-pixels 21b overlaps orthographic projections of the first electrodes 211 of the first blue sub-pixels 21b. Additionally or alternatively, in the first pixel structure, in the stacking direction X, an orthographic projection of a first gate electrode 111 of a first driving transistor 11 configured to drive the first red sub-pixels 21a overlaps orthographic projections of the first electrodes 211 of the first red sub-pixels 21a. With the above arrangement, the area of the spacing region occupied by the first driving transistors 11 is reduced, and it can also be ensured that in the first display area AA1, the first gate electrode 111 of the first driving transistor 11 configured to drive the first sub-pixels 21 emitting a same color is not affected by the first electrodes 211 of the first sub-pixels 21 emitting different colors. Thus, cross-talk of light brightness does not occur between the first sub-pixels 21 emitting different colors.

In an optional implementation, in the first pixel structure, the first red sub-pixels 21a and the first blue sub-pixels 21b constitute a plurality of first rows of sub-pixels which all extend along a first direction Y. The plurality of first green sub-pixels 21c constitute a plurality of second rows of sub-pixels which extend along the first direction Y. The plurality of first rows of sub-pixels and the plurality of second rows of sub-pixels are arranged alternately in a second direction Z. The first red sub-pixels 21a and the first blue sub-pixels 21b included in each first row of sub-pixels are arranged alternately. A spacing region is formed between the first red sub-pixels 21a and the first blue sub-pixels 21b. In the stacking direction X, the orthographic projection of the first gate electrode 111 of the first driving transistor 11 configured to drive the first green sub-pixels 21c is within the spacing region.

With the above arrangement, it can be better ensured that in the first display area AA1, the first gate electrode 111 of the first driving transistor 11 configured to drive the first sub-pixels 21 emitting a same color is not affected by the first electrodes 211 of the first sub-pixels 21 emitting different colors, and the row and column arrangement of the first driving transistors 11 is better facilitated.

In an optional implementation, in the display panel 100 provided by the above embodiments, the plurality of first sub-pixels 22 in the first pixel structure include first green sub-pixels 22c, first red sub-pixels 22a and first blue sub-pixels 22b. In the stacking direction X, an orthographic projection of a first gate electrode 121 of a first driving transistor 12 configured to drive the first green sub-pixels 22c does not overlap orthographic projections of the first electrodes 221.

Optionally, in the second pixel structure, in the stacking direction X, an orthographic projection of a second gate electrode 121 of a second driving transistor 12 configured to drive the second blue sub-pixels 22b overlaps orthographic projections of the second electrode 221 of the second blue sub-pixels 22b. Additionally/alternatively, in the second pixel structure, in the stacking direction X, an orthographic projection of a second gate electrode 121 of a second driving transistor 12 configured to drive the second red sub-pixels 22a overlaps orthographic projections of the second electrodes 221 of the second red sub-pixels 22a. With the above arrangement, the space of the spacing region occupied by the second driving transistors 12 is reduced, and it can also be ensured that in the second display area AA2, the second gate electrode 121 of the second driving transistor 12 configured to drive the second sub-pixels 22 emitting a same color is not affected by the second electrodes 221 of the second sub-pixels 22 emitting different colors. Thus, cross-talk of light brightness does not occur between the second sub-pixels 22 emitting different colors.

In an optional implementation, in the second pixel structure, the second red sub-pixels 22a and the second blue sub-pixels 22b constitute a plurality of third rows of sub-pixels which all extend along the first direction Y. The plurality of second green sub-pixels 22c constitute a plurality of fourth rows of sub-pixels which extend along the first direction Y. The plurality of third rows of sub-pixels and the plurality of fourth rows of sub-pixels are arranged alternately in a second direction Z. The second red sub-pixels 22a and the second blue sub-pixels 22b included in each third row of sub-pixels are arranged alternately. A spacing region is formed between the second red sub-pixels 22a and the second blue sub-pixels 22b. In the stacking direction X, the orthographic projection of the second gate electrode 121 of the second driving transistor 12 configured to drive the second green sub-pixels 22c is within the spacing region.

With the above arrangement, it can better ensured that in the second display area AA2, the second gate electrode 121 of the second driving transistor 12 configured to drive the second sub-pixels 22 emitting a same color is not affected by the second electrodes 221 of the second sub-pixels 22 emitting different colors. Further, it can also be ensured that the coupling condition of the first gate electrode 111 of the first driving transistor 11 to the corresponding first electrodes 211 in the transitional display area AA1b is consistent or tends to be consistent with the coupling condition of the second gate electrode 121 of the second driving transistor 12 to the corresponding second electrodes 221 in the second display area AA2. It is further ensured that the brightness of the main and auxiliary screens is consistent, and the brightness of the main and auxiliary screens is not different when the display panel 100 performs switching from a white image to a monochrome image.

Figure 7:
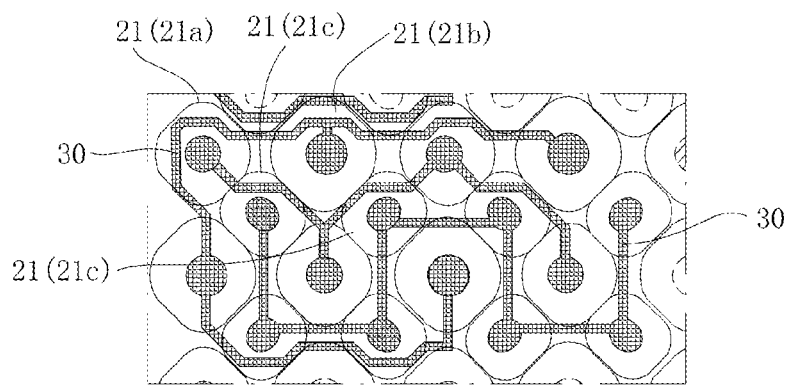
FIG. 7 is a schematic partial enlarged diagram of a corresponding transparent display area of a display panel according to another embodiment of the present application.

As shown in FIG. 7, the display panel 100 provided by the above embodiments further includes an interconnection structure 30. In the transparent display area AA1a, first electrodes 211 of two or more first sub-pixels 21 emitting a same color are electrically connected via the interconnection structure 30 and are driven by a same first driving transistor 11. With the above arrangement, first sub-pixels 21 emitting a same color in the transparent display area AA1a are driven by a same first driving transistor 11, reducing the number of first driving transistors 11 and the wiring in the transparent display area AA1*a*, thereby better satisfying the light transmittance requirement of the transparent display area AA1*a*.

Optionally, the interconnect structure 30 is a wire-shaped structure. Optionally, the interconnect structure 30 may be made of a transparent material.

It will be appreciated that, although in each of the above embodiments, the arrangement of the second sub-pixels 22 of the second pixel structure includes RGBG and the arrangement of the first sub-pixels 21 of the first pixel structure includes RGBD, those arrangements are optional. In some other examples, the arrangement of the first sub-pixels 21 of the first pixel structure and the arrangement of the second sub-pixels 22 of the second pixel structure may both include repeating arrangement of the combination order of RGBG.

In actual practice, the first driving transistor configured to drive the first sub-pixels 21 in the transparent display area AA1*a* may be placed in the transition display area AA1. When the transparent display area includes the interconnection structure 30, the number of interconnected first electrodes 211 of first sub-pixels 21 emitting a same color in the transparent display area AA1*a* may be set as required. In some examples, first electrodes 211 of every four first red sub-pixels 21*a* may be electrically connected via the interconnection structure 30 and driven by a same first driving transistor 11. First electrodes 211 of every four first blue sub-pixels 21*b* are electrically connected via the interconnection structure 30 and driven by a same first driving transistor 11. First electrodes 211 of every eight first green sub-pixels 21*c* are electrically connected via the interconnection structure 30 and are driven by a same first driving transistor 11. At this time, the interconnection structure 30 for connecting the first green sub-pixels 21*c* may have an S-typed/arch-shaped wiring. With the above arrangement, not only the interconnection requirements of the first sub-pixels emitting a same color can be satisfied, but also the influence of the interconnection structure 30 on the first gate electrode 111 can be reduced.

Of course, the numbers of interconnected first electrodes 211 of the first sub-pixels 21 emitting same colors as described above are only an optional implementation, and the numbers of interconnected first electrodes 211 of the first sub-pixels 21 emitting same colors are not limited thereto, as long as the light transmittance requirement of the transparent display area AA1*a* and the display requirement can be satisfied and the influence on the first gate electrode 111 can be reduced.

Figure 8:
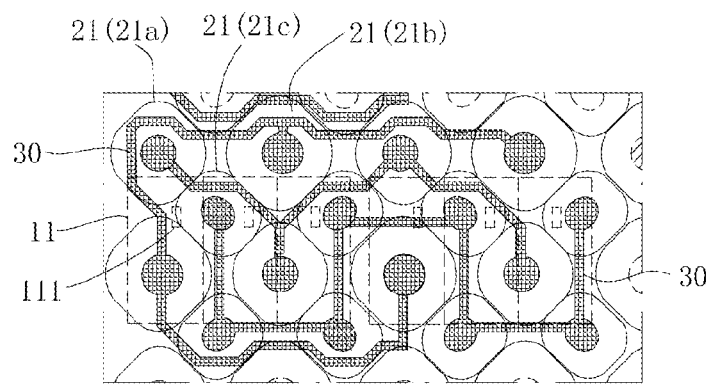
FIG. 8 is a schematic partial enlarged diagram of a corresponding transition display area of a display panel according to yet another embodiment of the present application.
Figure 9:
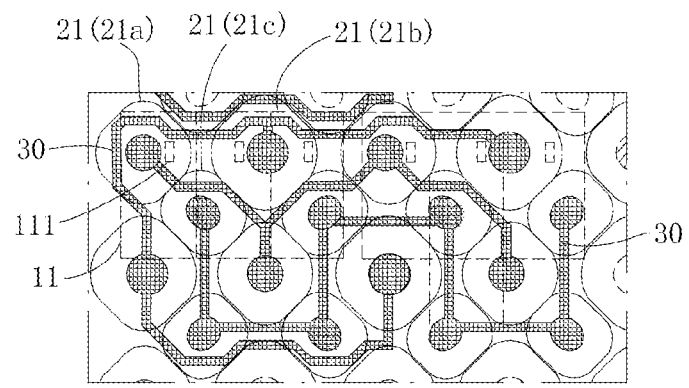
FIG. 9 is a schematic partial enlarged diagram of a corresponding transition display area of a display panel according to yet another embodiment of the present application.
Figure 10:
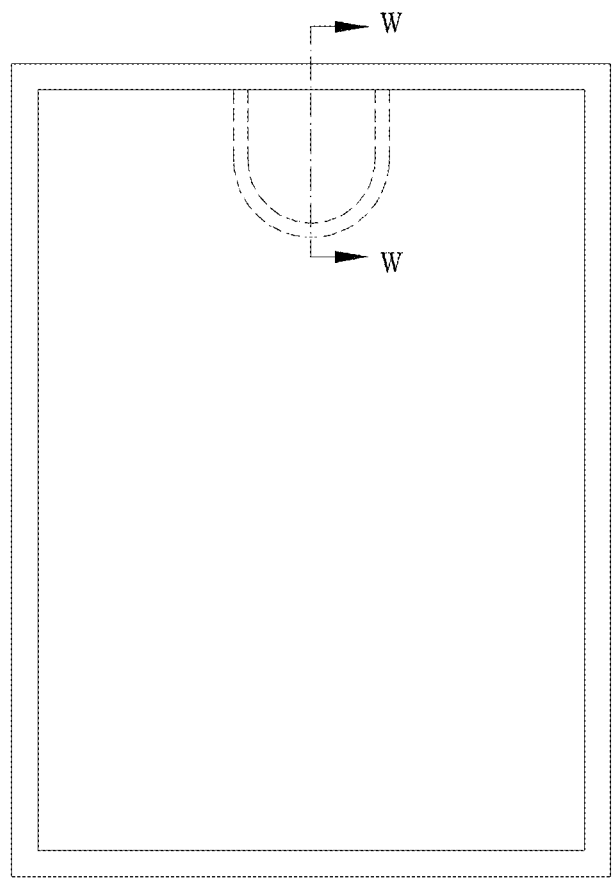
FIG. 10 is a schematic structural diagram of a top view of a display apparatus according to an embodiment of the present application.
Figure 11:
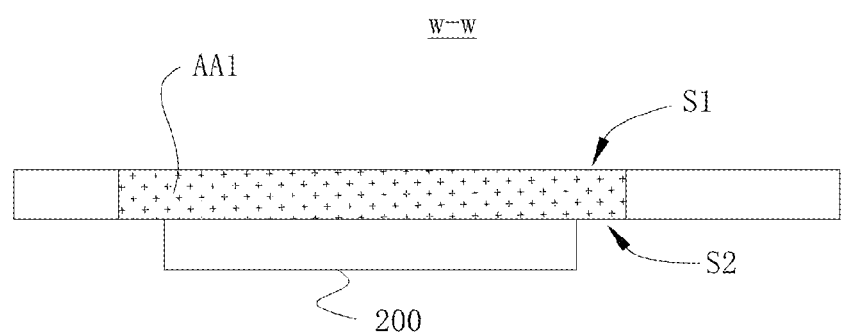
FIG. 11 is a schematic structural diagram of a partial cross-sectional view taken along the direction w-w in FIG. 10.

In some optional embodiments of the display panel 100, as shown in FIG. 8 and FIG. 9, in the transition display area AA1*b*, first electrodes 211 of two or more first sub-pixels 21 emitting a same color are electrically connected via the interconnect structure 30 and driven by a same first driving transistor 11. The interconnection manners of the first electrodes 211 of the first sub-pixels 21 emitting the same color in the transition display area AA1*b* can be referred to the interconnection manners of the first electrodes 211 of the corresponding the first sub-pixels 21 in the above transparent display area AA1*a*, which will not be repeated here.

By interconnecting the first electrodes 211 of the first sub-pixels 21 in the transition display area AA1*b*, the number of the first driving transistors 11 can be further reduced, and it is better ensured that the light transmittance of the transition display area AA1*b* can be between those of the transparent display area AA1*a* and the second display area AA2, optimizing the display effect of the display panel 100.

It will be appreciated that, in the embodiments described above, first gate electrodes 111 of a part of the first driving transistors 11 overlap a first electrode 211 of any first sub-pixel 21 emitting the same color as the first sub-pixels 21 driven by the part of the first driving transistors 11. Of course, this is merely an optional implementation and is not for limitation. In some other examples, in the stacking direction X, the orthographic projections of the first gate electrodes 111 of the first driving transistors 11 does not overlap the orthographic projections of the first electrodes 211 of the first sub-pixels 21.

With the above-mentioned arrangement, it can also be satisfied that in the first display area AA1, the first gate electrode 111 of the first driving transistor 11 configured to drive the first sub-pixels 21 emitting the same color is not affected by the first electrodes 211 of the first sub-pixels 21 emitting different colors, so as to reduce or avoid the difference in display brightness between the first display area AA1 and the second display area AA2 and ensure good display effect. Especially when the first electrodes 211 of the first sub-pixels 21 emitting the same color in the transparent display area AA1*a* and/or the transition display area AA1*b* are interconnected via the interconnection structure 30, an implementation structure in which the orthographic projection of the first gate electrode 111 of each first driving transistor 11 in the stacking direction X does not overlap the orthographic projection of the first electrodes 211 of first sub-pixels 21 may be used.

With continuing reference to FIG. 1 to FIG. 9, in some optional embodiments, the display panel 100 may further include a pixel definition layer 23 including first pixel openings 231 arranged in the first display area AA1 and second pixel openings 232 arranged in the second display area AA2. Each first sub-pixel 21 is located at one of the first pixel openings 231. The first sub-pixel 21 further includes a first light-emitting structure 212 and a third electrode 213. The first light-emitting structure 212 is located between the first electrode 211 and the third electrode 213, and the first electrode 211 is arranged close to the side of the device layer 10. In the stacking direction X, the orthographic projection of one first gate electrode 111 is at least partly within the orthographic projection of the first pixel opening 231. This arrangement facilitates the control of the corresponding first sub-pixel, and can better ensure good light transmission effect of the transitional display area AA1*b*, so that the light transmittance of the transitional display area AA1*b* can be between the first display area AA1 and the second display area AA2.

Optionally, each second sub-pixel 22 is located at one of the second pixel openings 232. Each second sub-pixel 22 further includes a second light emitting structure 222 and a fourth electrode 223. The second light emitting structure 222 is located between the second electrode 221 and the fourth electrode 223, and the second electrode 221 is located close to the device layer 10.

Optionally, in the display panel 100, the first electrode 211 and the second electrode 221 are both anodes and may be provided in a same layer. The third electrode 213 and the fourth electrode 223 are both cathodes and may be provided in a same layer. Optionally, the first gate electrode 111 and the second gate electrode 121 are provided in a same layer.

In an optional embodiment, the first electrode 211 may be a light-transmitting electrode. In some embodiments, the first electrode 211 includes an Indium Tin Oxide (ITO) layer or an indium zinc oxide layer.

In the display panel 100 provided by the embodiments of the present application, the light transmittance of the light-transmitting display area of the display panel 100 is greater than the light transmittance of the second display area AA2 of the display panel 100, and thus the under-screen integration of photosensitive elements such as image acquiring elements can be met can be met.

Since the display panel 100 includes the device layer 10 and the light-emitting element layer 20, and the device layer 10 includes the first driving transistors 11 located in the transition display area AA1b and the second driving transistors 12 located in the second display area AA2, one or more first sub-pixels 21 emitting the same color in the transition display area AA1b and the transparent display area AA1a can be driven by the first driving transistor 11 to perform image displaying and the second sub-pixels 22 located in the second display area AA2 can be driven by the second driving transistor 12 to perform image displaying. Thus, the screen-to-body ratio of the display panel 100 is improved to better meet the full-screen display requirements.

Furthermore, in the stacking direction X the light-emitting layer 20 stacked with the device layer 10, the orthographic projection of the first gate electrode 111 of one first driving transistor 11 does not overlap the orthographic projection of the first electrode 211 of the first sub-pixel 21 emitting a color different from another first sub-pixel 21 driven by the first driving transistor 11, so that in the first display area AA1, the first gate electrode 111 of the first driving transistor 11 configured to drive the first sub-pixels 21 emitting a same color is not affected by the first electrodes 211 of the first sub-pixels 21 emitting other colors, which reduces or avoids the display brightness difference between the first display area AA1 and the second display area AA2, ensuring good display effect.

Another aspect of the present application further provides a display apparatus including the display panel 100 according to any one of the above embodiments. The display panel 100 includes the first display area AA1 and the second display area AA2. The first display area AA1 includes the transparent display area AA1a and the transition display area AA1b. The light transmittance of the transparent display area AA1a is greater than the light transmittance of the transition display area AA1b. The display panel 100 includes opposing first and second surfaces S1 and S2, where the first surface S1 is a display surface. The display apparatus further includes a photosensitive component 200 located on the second surface S2 side of the display panel 100. The photosensitive component 200 corresponds to the position of the transparent display area AA1a in the first display area AA1.

The photosensitive component 200 may be an image capturing device for capturing external image information. In the embodiments, the photosensitive component 200 may be a complementary metal oxide semiconductor (CMOS) image capture device. In some other embodiments, the photosensitive component 200 may be a charge-coupled device (CCD) image capturing device or other form of image capturing device. It can be understood that the photosensitive component 2 may not be limited to an image capturing device. For example, in some embodiments, the photosensitive component 200 may be a light sensor such as an infrared sensor, a proximity sensor, an infrared lens, a flood sensing element, an ambient light sensor, and a dot matrix projector. In addition, in the display apparatus 100, other components may further be integrated on the second surface of the display panel, such as an earpiece, a speaker, etc.

In the display apparatus according to the embodiments of the present application, the light transmittance of the transparent display area AA1a is greater than the light transmittance of the second display area AA2, so that the display panel 100 can be integrated with the photosensitive component 200 on the back side of the transparent display area AA1a, to realize under-screen integration of the photosensitive component 200 such as the image acquiring device. At the same time, the first display area AA1 can display images, which increases the display area of the display panel 100 and realizes a full-screen design of the display apparatus.

In addition, since the orthographic projection of the first gate electrode 111 of each first driving transistor 11 does not overlap the orthographic projection of the first electrode 211 of the first sub-pixel 21 emitting a different color than the first sub-pixel 21 driven by the first driving transistor 11 in the stacking direction X the light-emitting element layer 20 stacked with the device layer 10, so that in the first display area AA1, the first gate electrode 211 of the first driving transistor 11 configured to drive the first sub-pixels 21 emitting the same color is not affected by the first electrodes 211 of the first sub-pixels 21 emitting other colors, this reduces or avoids the display brightness difference between the first display area AA1 and the second display area AA2, ensuring good display effect.

Furthermore, in the stacking direction X, the orthographic projection of the second gate electrode 121 of each second driving transistor 12 does not overlap with the orthographic projection of the first electrode 211 of a second sub-pixel 22 emitting a different color to the second sub-pixel 22 driven by the second driving transistor 12, so that when the optimal gamma parameter is lowered in white images of the display panel to make the brightness of the first display area AA1 and the second display area AA2 consistent, it can be ensured that there is no difference in the brightness between the first display area AA1 and the second display area AA2 when the display panel 100 switches from a white image to a monochrome image, which makes the display apparatus easily to be widely used.

Although the present application has been described with reference to the preferred embodiments, various modifications may be made thereto and components thereof may be replaced with equivalents without departing from the scope of the present application. In particular, as long as there is no structural conflict, the technical features mentioned in the embodiments can be combined in any manner. The present application is not limited to the specific embodiments disclosed herein, instead, it includes all technical solutions that fall within the scope of the claims.

What is claimed is:

1. A display panel, comprising a first display area and a second display area, the first display area comprising a transparent display area and a transition display area located between the transparent display area and the second display area, light transmittance of the transparent display area being greater than light transmittance of the second display area, the display panel comprising:
a light-emitting element layer comprising a first pixel structure arranged in the first display area, the first pixel structure comprising a plurality of first sub-pixels, and each of first sub-pixels comprising a first electrode;
a device layer stacked on the light-emitting element layer and comprising a plurality of first driving transistors located in the transition display area, each of the first driving transistors configured to drive one or more first sub-pixels emitting a same color, and each of the first driving transistors comprising a first gate electrode;

wherein the light-emitting element layer further comprises a second pixel structure arranged in the second display area, the second pixel structure comprises a plurality of second sub-pixels, each of the second sub-pixels comprises a second electrode, the device layer further comprises a plurality of second driving transistors located in the second display area and configured to drive the second sub-pixels, each of the second driving transistors comprise a second gate electrode, and in the stacking direction, an orthographic projection of a second gate electrode of one of the second driving transistors does not overlap an orthographic projection of a second electrode of a second sub-pixel emitting a color different from another second sub-pixel driven by the second driving transistor.

2. The display panel according to claim 1, wherein the first pixel structure and the second pixel structure have a same arrangement structure;

wherein an arrangement manner of the second sub-pixels of the second pixel structure comprises red, green, blue, green (RGBG), and an arrangement manner of the first sub-pixels of the first pixel structure comprises red, green, blue, dummy (RGBD) or RGBG;

the first driving transistors are arranged in rows and columns; and, the second driving transistors are arranged in rows and columns;

the display panel further comprising a pixel definition layer, wherein the pixel definition layer comprises a plurality of first pixel openings arranged in the first display area and a plurality of second pixel openings arranged in the second display area, each of the first sub-pixels is located in one of the first pixel openings, and each of the second sub-pixels is located in one of the second pixel openings;

wherein in the stacking direction, orthographic projections of one or more of the first gate electrodes are at least partially within orthographic projections of the first pixel openings.

3. The display panel according to claim 1, wherein in the stacking direction, an orthographic projection of at least one of the first gate electrodes does not overlap orthographic projections of the first electrodes of the first sub-pixels;

in the stacking direction, an orthographic projection of at least one of the first gate electrodes overlaps orthographic projection of the first electrode of the first sub-pixel.

4. The display panel according to claim 1, wherein the plurality of first sub-pixels in the first pixel structure comprise a plurality of first green sub-pixels, a plurality of first red sub-pixels, and a plurality of first blue sub-pixels, and in the stacking direction, an orthographic projection of a first gate electrode of a first driving transistor configured to drive the first green sub-pixels does not overlap the orthographic projections of the first electrodes.

5. The display panel according to claim 1, wherein the plurality of first sub-pixels in the first pixel structure comprise a plurality of first green sub-pixels, a plurality of first red sub-pixels, and a plurality of first blue sub-pixels, and in the transition display area, in the stacking direction, an orthographic projection of a first gate electrode of a first driving transistor configured to drive the first blue sub-pixels overlaps orthographic projections of the first electrodes of the first blue sub-pixels.

6. The display panel according to claim 1, wherein the plurality of first sub-pixels in the first pixel structure comprise a plurality of first green sub-pixels, a plurality of first red sub-pixels, and a plurality of first blue sub-pixels, and in the transition display area, in the stacking direction, an orthographic projection of a first gate electrode of a first driving transistor configured to drive the red first sub-pixels overlaps orthographic projections of first electrodes of the red first sub-pixels.

7. The display panel according to claim 1, wherein the plurality of first sub-pixels in the first pixel structure comprise a plurality of first green sub-pixels, a plurality of first red sub-pixels, and a plurality of first blue sub-pixels, and the first red sub-pixels and the first blue sub-pixels are spaced and alternately arranged in a first direction and form a spacing region, and in the stacking direction, the orthographic projection of the first gate electrode of the first driving transistor configured to drive the first green sub-pixels is located in the spacing region.

8. The display panel according to claim 1, wherein in the stacking direction, an orthographic projection of at least one of the second gate electrodes does not overlap orthographic projections of the second electrodes.

9. The display panel according to claim 1, wherein the plurality of second sub-pixels in the second pixel structure comprise a plurality of second green sub-pixels, a plurality of second red sub-pixels, and a plurality of second blue sub-pixels, and in the stacking direction, an orthographic projection of a second gate electrode of a second driving transistor configured to drive the green second sub-pixels does not overlap the orthographic projections of the second electrodes.

10. The display panel according to claim 1, wherein the plurality of second sub-pixels in the second pixel structure comprise a plurality of second green sub-pixels, a plurality of second red sub-pixels, and a plurality of second blue sub-pixels, and in the stacking direction, an orthographic projection of a second gate electrode of a second driving transistor configured to drive the blue second sub-pixels overlaps orthographic projections of the second electrodes of the second blue sub-pixels.

11. The display panel according to claim 1, wherein the plurality of second sub-pixels in the second pixel structure comprise a plurality of second green sub-pixels, a plurality of second red sub-pixels, and a plurality of second blue sub-pixels, and in the stacking direction, an orthographic projection of a second gate electrode of a second driving transistor configured to drive the red second sub-pixels overlaps orthographic projections of the second electrodes the second red sub-pixels.

12. The display panel according to claim 1, wherein the plurality of second sub-pixels in the second pixel structure comprise a plurality of second green sub-pixels, a plurality of second red sub-pixels, and a plurality of second blue sub-pixels, and in the second pixel structure, the second red sub-pixels and the second blue sub-pixels are spaced and alternately arranged in a first direction and form a spacing region, and in the stacking direction, the orthographic projection of the second gate electrode of the second driving transistor configured to drive the second green sub-pixels is located in the spacing region.

13. The display panel according to claim 1, wherein the first electrodes and the second electrodes are anodes.

14. The display panel according to claim 1, wherein the first gate electrodes and the second gate electrodes are disposed in a same layer.

15. The display panel according to claim 1, further comprising an interconnection structure, wherein in the transparent display area, first electrodes of two or more first sub-pixels emitting a same color are electrically connected via the interconnection structure and driven by a same first driving transistor.

16. The display panel according to claim 1, wherein in the transition display area, first electrodes of two or more first sub-pixels emitting a same color are electrically connected via the interconnection structure and driven by a same first driving transistor.

17. The display panel according to claim 1, wherein each of the first driving transistors configured to drive one or more first sub-pixels emitting a same color in the transition display area and the transparent display area.

18. The display panel according to claim 1, wherein in a stacking direction of the light-emitting element layer stacked on the device layer, an orthographic projection of a first gate electrode of one of the first driving transistors does not overlap an orthographic projection of a first electrode of a first sub-pixel emitting a color different from another first sub-pixel driven by the first driving transistor.

19. The display panel according to claim 1, wherein each of the first driving transistors configured to drive a plurality of first sub-pixels emitting a same color.

20. A display panel, comprising a first display area and a second display area, the first display area comprising a transparent display area and a transition display area located between the transparent display area and the second display area, light transmittance of the transparent display area being greater than light transmittance of the second display area, the display panel comprising:

a light-emitting element layer comprising a first pixel structure arranged in the first display area, the first pixel structure comprising a plurality of first sub-pixels, and each of first sub-pixels comprising a first electrode;

a device layer stacked on the light-emitting element layer and comprising a plurality of first driving transistors located in the transition display area, each of the first driving transistors configured to drive a plurality of first sub-pixels emitting a same color, and each of the first driving transistors comprising a first gate electrode.

\* \* \* \* \*